(12) United States Patent
Li et al.

(10) Patent No.: US 7,791,925 B2
(45) Date of Patent: Sep. 7, 2010

(54) STRUCTURES FOR RESISTIVE RANDOM ACCESS MEMORY CELLS

(75) Inventors: Shaoping Li, Naperville, IL (US); Insik Jin, Eagan, MN (US); Zheng Gao, Savage, MN (US); Eileen Yan, Edina, MN (US); Kaizhong Gao, Eden Prairie, MN (US); Haiwen Xi, Prior Lake, MN (US); Song Xue, Edina, MN (US)

(73) Assignee: Seagate Technology, LLC, Scotts Valley, CA (US)

(*) Notice: Subject to any disclaimer, the term of this patent is extended or adjusted under 35 U.S.C. 154(b) by 97 days.

(21) Appl. No.: 12/262,262

(22) Filed: Oct. 31, 2008

(65) Prior Publication Data

US 2010/0110758 A1 May 6, 2010

(51) Int. Cl.
*G11C 7/00* (2006.01)
(52) U.S. Cl. ............................ 365/148; 365/158
(58) Field of Classification Search ........... 365/148, 365/158
See application file for complete search history.

(56) References Cited

U.S. PATENT DOCUMENTS

| | | | | |
|---|---|---|---|---|
| 6,104,632 A | * | 8/2000 | Nishimura | 365/158 |
| 6,111,784 A | * | 8/2000 | Nishimura | 365/173 |
| 7,608,848 B2 | * | 10/2009 | Ho et al. | 257/3 |
| 2008/0089104 A1 | * | 4/2008 | Tanaka et al. | 365/53 |
| 2008/0304311 A1 | * | 12/2008 | Philipp et al. | 365/148 |

OTHER PUBLICATIONS

J.C. Bruyere et al., Appl. Phys. Letters (16) 40 (1970).
Kohtaroch Gotoh et al., Jpn. J. Appl. Phys. (25) 39 (1996).
H. Kohlstedt et al., Physical Rev. B (72) 125431( 2005).

* cited by examiner

*Primary Examiner*—Michael T Tran
(74) *Attorney, Agent, or Firm*—Campbell Nelson Whipps LLC

(57) ABSTRACT

A resistive random access memory (RRAM) cell that includes a first electrode having a lower portion, a continuous side portion and an upper portion, the lower portion and the continuous side portion having an outer surface and an inner surface; a resistive layer having a lower portion, a continuous side portion and an upper portion, the lower portion and the continuous side portion having an outer surface and an inner surface; and a second electrode having a lower portion, an upper portion and an outer surface; wherein the outer surface of the resistive layer directly contacts the inner surface of the first electrode.

20 Claims, 9 Drawing Sheets

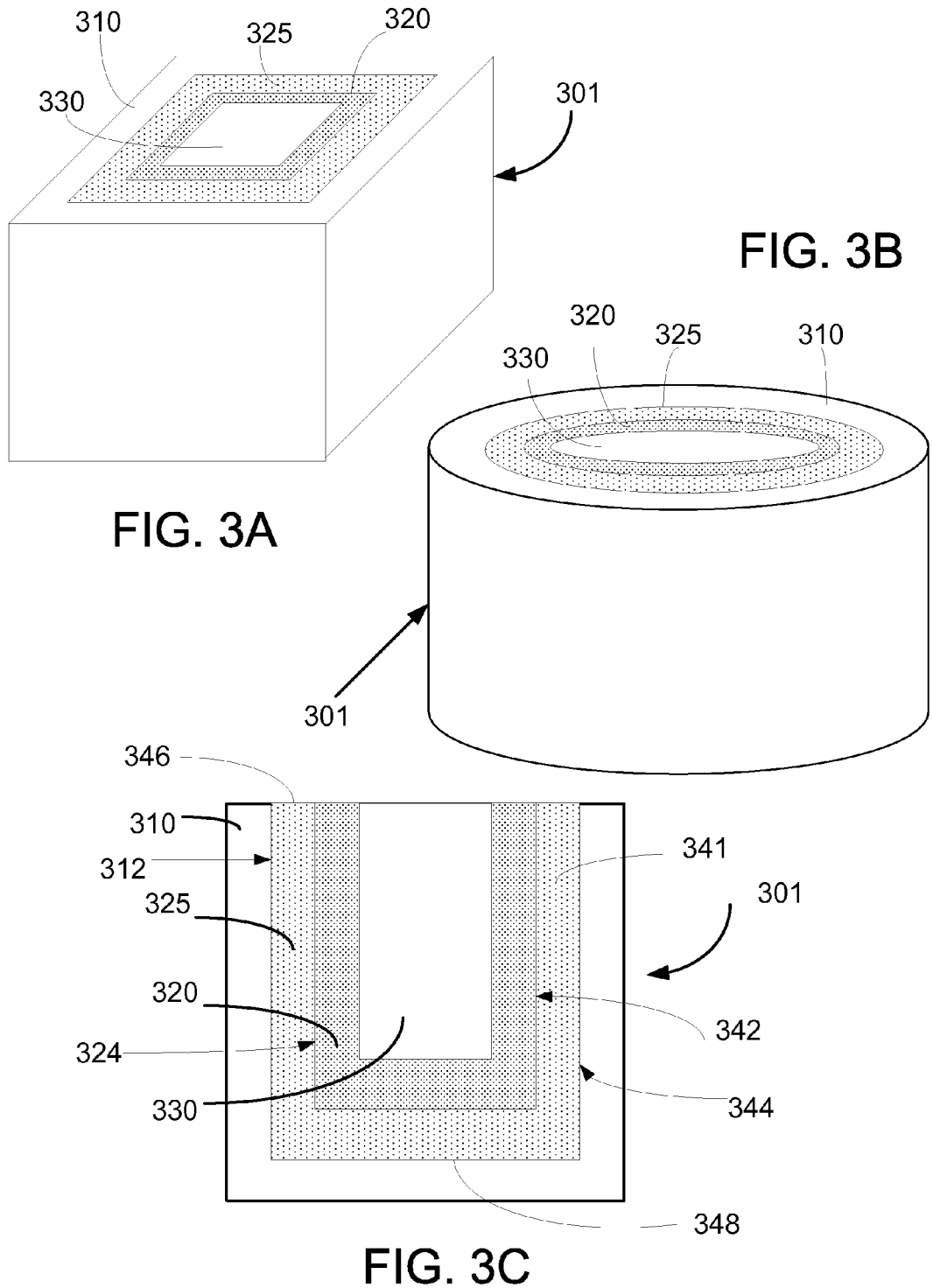

STRUCTURES FOR RESISTIVE RANDOM ACCESS MEMORY CELLS

BACKGROUND

Resistive random access memory (RRAM) is a nonvolatile memory type that is one possible target for future advancement in memory technology. Generally, RRAM usually employs a dielectric material, which although normally insulating can be made to conduct through a filament or conduction path formed after application of a sufficiently high voltage. Once the filament is formed, it may be reset (broken, resulting in a high resistance) or set (re-formed, resulting in a lower resistance) by an appropriately applied voltage. The low and high resistance are utilized to indicate a "1" or "0", thereby allowing for data storage.

New and different configurations that may offer practical advantages to RRAM are an ongoing area of research.

BRIEF SUMMARY

Disclosed herein is a resistive random access memory (RRAM) cell that includes a first electrode having a lower portion, a continuous side portion and an upper portion, the lower portion and the continuous side portion having an outer surface and an inner surface; a resistive layer having a lower portion, a continuous side portion and an upper portion, the lower portion and the continuous side portion having an outer surface and an inner surface; and a second electrode having a lower portion, an upper portion and an outer surface; wherein the outer surface of the resistive layer directly contacts the inner surface of the first electrode.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIGS. 3A, 3B and 3C are perspective views (FIGS. 3A and 3B) and a cross section (FIG. 3C) of a RRAM cell as exemplified;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
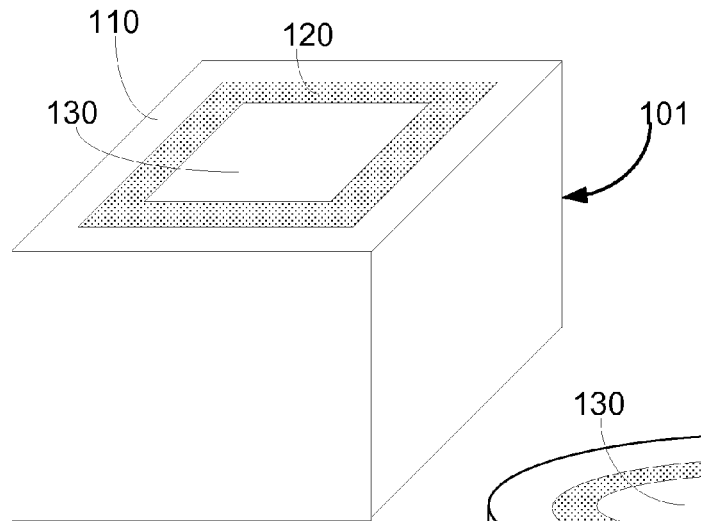
FIGS. 1A, 1B and 1C are perspective views (FIGS. 1A and 1B) and a cross section (FIG. 1C) of a RRAM cell as exemplified.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

Disclosed herein is a resistive random access memory (RRAM) cell. In an embodiment, a RRAM cell as disclosed herein has a trench structure. A RRAM cell as disclosed herein generally includes a first electrode, a resistive layer and a second electrode, with the resistive layer being disposed between the first electrode and the second electrode.

Figure 1B:
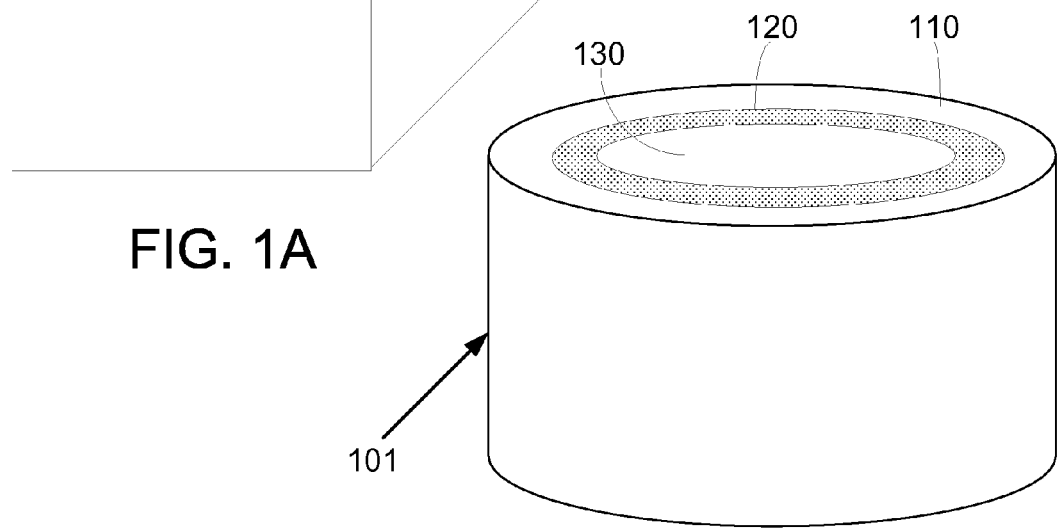

An exemplary RRAM cell is illustrated in the perspective views of FIGS. 1A and 1B. The RRAM cell in FIGS. 1A and 1B includes a first electrode 110, a resistive layer 120 and a second electrode 130. The first electrode 110, the resistive layer 120 and the second electrode 130 generally have structures that nest inside one another, i.e. the second electrode 130 nests in the resistive layer 120 and the resistive layer 120 nests in the first electrode 110. The particular structure or shape of the individual components (the first electrode 110, the resistive layer 120 and the second electrode 130) is not generally limited in that their structures are related so that they are able to be nested structures. Although not depicted in FIGS. 1A, 1B and 1C, the RRAM cell can be located or formed within, disposed on, or partially located or formed within a substrate.

In an exemplary embodiment depicted in FIG. 1A, the second electrode 130 could be a cuboid (or rectangular prism) having a particular relationship between the length, height and depth. The resistive layer 120 could be a cuboid having the same particular relationship of length, height and depth but having an empty volume inside of the cuboid in which the second electrode 130 can be encompassed. The first electrode 110 could be a cuboid having the same particular relationship of length, height and depth but having an empty volume inside of the cuboid in which the resistive layer 120 can be encompassed.

FIG. 1B depicts another exemplary embodiment of a RRAM cell. In this embodiment, the second electrode 130 could be a right circular cylinder having a particular relationship between the height and radius. The resistive layer 120 could be a right circular cylinder having the same particular relationship between height and radius but having an empty volume inside of the right circular cylinder in which the second electrode 130 can be encompassed. The first electrode 110 could be a right circular cylinder having the same particular relationship between height and radius but having an empty volume inside of the right circular cylinder in which the resistive layer 120 can be encompassed. It will also be understood that shapes other those depicted in FIGS. 1A and 1B, such as for example, elliptic cylinders, parabolic cylinders, hyperbolic cylinders, and cubes can be utilized in exemplary RRAM cells as disclosed herein.

Figure 1C:
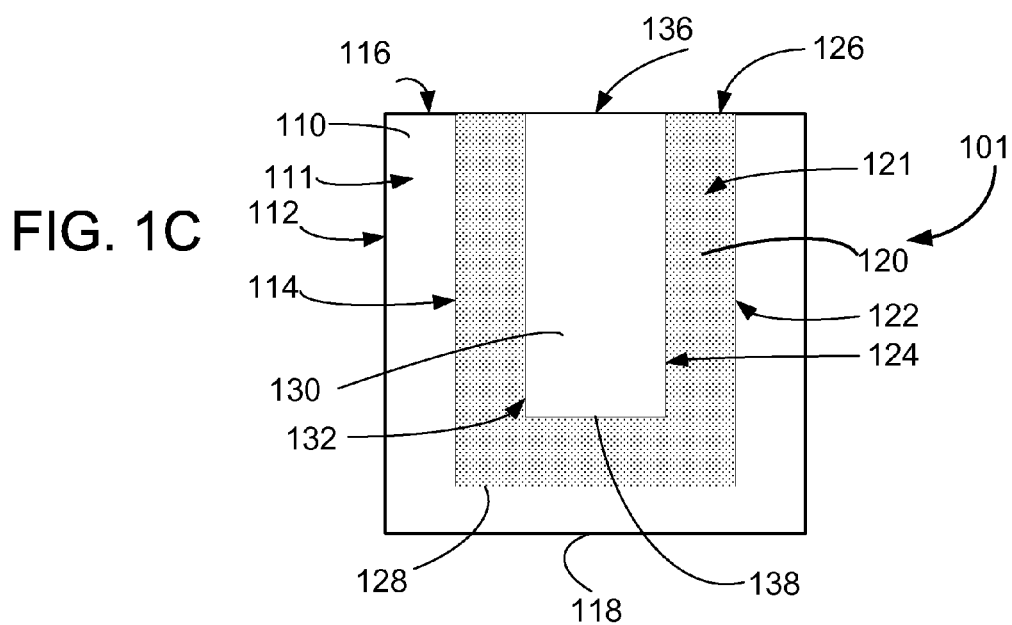

FIG. 1C depicts a cross section of an exemplary RRAM cell. The first electrode 110 has a lower portion 118, a continuous side portion 111 and an upper portion 116. In an embodiment where the RRAM cell has the shape of a right circular cylinder for example, the lower portion 118 is generally the bottom of the cylinder, the continuous side portion 111 is generally the side of the cylinder, and the upper portion 116 is generally the part of the first electrode 110 that would be the top of the cylinder. In such an embodiment, the lower portion 118 has a larger volume or amount of material than the upper portion 116 because part of the upper portion 116 is removed to allow the resistive layer 120 to be nested inside the first electrode 110. The lower portion 118 and the continuous side portion 111 collectively have an outer surface 112 and an inner surface 114. The first electrode 110 can generally have the shape of a hollow cube or hollow cylinder for example.

The exemplary RRAM cell also includes a resistive layer 120. The resistive layer 120 has a lower portion 128, a continuous side portion 121 and an upper portion 126. The lower portion 128 and the continuous side portion 121 have an outer surface 122 and an inner surface 124. As discussed above, the resistive layer 120 nests inside the first electrode 110. The outer surface 122 of the resistive layer 120 contacts the inner surface 114 of the first electrode 110. In an embodiment, the outer surface 122 of the resistive layer 120 directly contacts the inner surface 114 of the first electrode 110. In an embodiment, the inner surface 124 of the resistive layer 120 contacts the outer surface 132 of the second electrode 130. In an embodiment, the inner surface 124 of the resistive layer 120 directly contacts the outer surface 132 of the second electrode 130.

The exemplary RRAM cell also includes a second electrode 130. The second electrode 130 has a lower portion 138 and an upper portion 136. The second electrode 130 is generally not characterized as having a continuous side portion because it is a solid three dimensional shape as opposed to a hollow three dimensional shape as the first electrode 110 and the resistive layer 120 are. The second electrode 130 nests inside the resistive layer 120. The second electrode 120 has an outer surface 132.

Figure 2A:
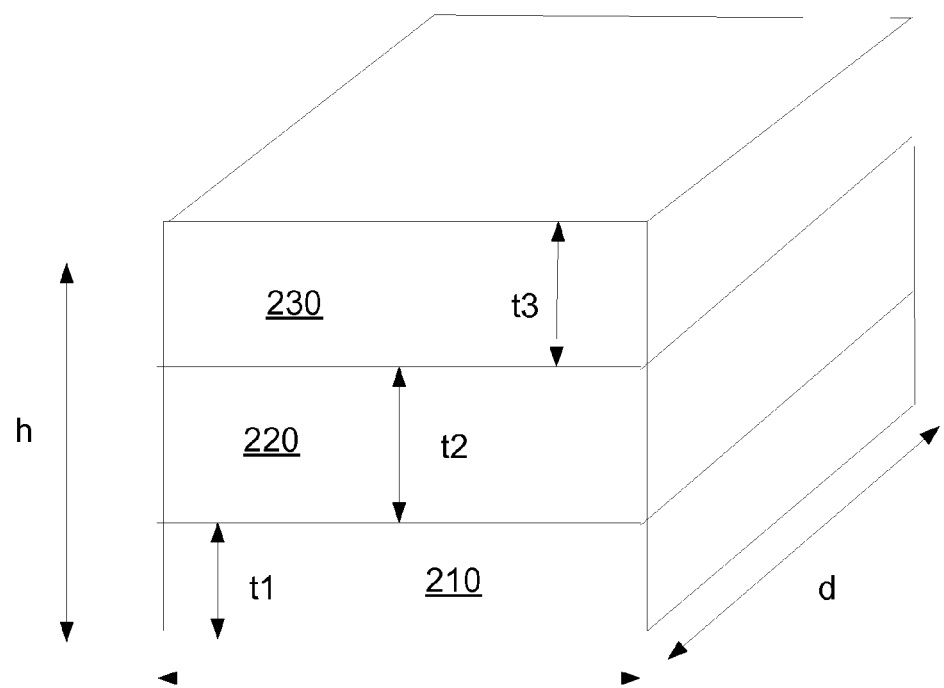
FIGS. 2A and 2B are perspective views of a memory cell as exemplified.
Figure 2B:
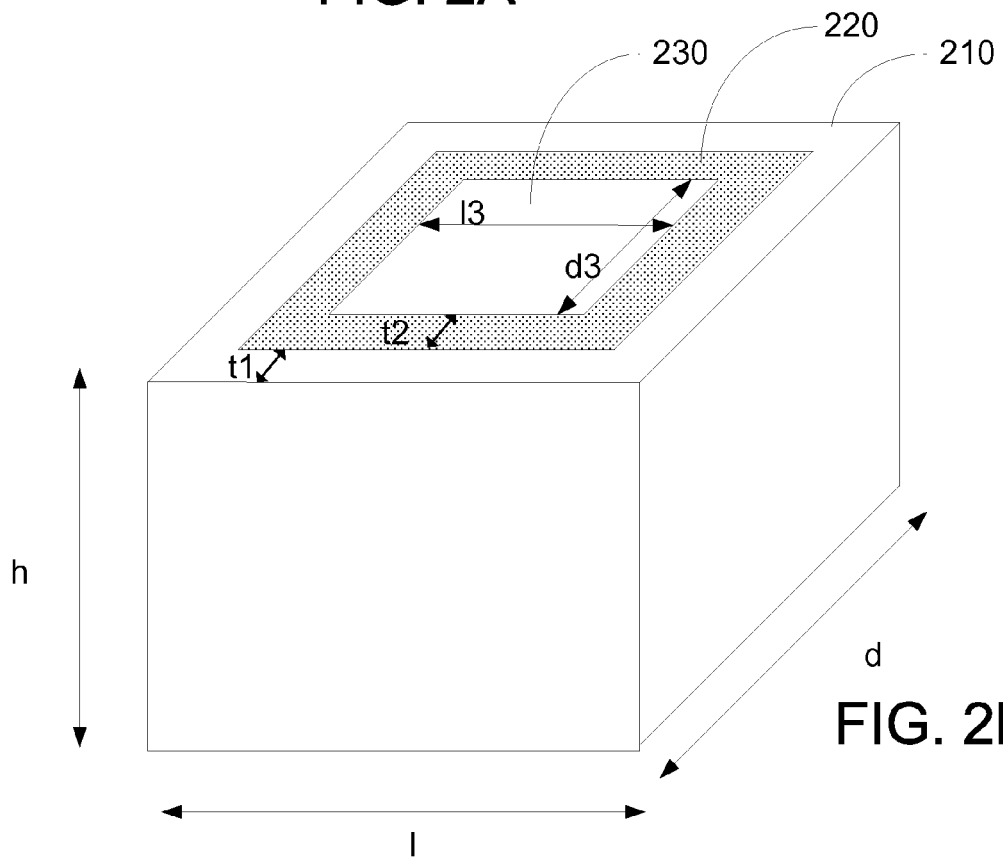

RRAM cells as disclosed herein generally afford a larger contact area between the electrodes and the resistive layer than do previously utilized RRAM cell structures. The size of the contact area is proportional to the strength of the signal of the RRAM cell and therefore can be indirectly proportional to the current required to read the cell. FIGS. 2A and 2B can be utilized to compare the contact areas in a RRAM cell as disclosed herein and a RRAM cell as previously utilized. As seen in FIG. 2A, which depicts a RRAM cell as previously utilized, the contact area between the first electrode 210 and the resistive layer 220 is given by the length (l) times the depth (d)=(l×d). In contrast to that the contact area between the first electrode 210 and the resistive layer 220 in a RRAM cell as disclosed herein is the contact area around all four sides of the RRAM cell. Therefore, the contact area equals 2(h−t1)(d−2t1)+2(h−t1)(l−2t1). The second electrode contact area with the resistive layer will be smaller than the first electrode (2(h−t1−t2)(d−2t1−2t2)+2(h−t1−t2)(l−2t1−2t2)), but will still be larger than in previously utilized RRAM cells. As seen from a comparison of these two situations, RRAM cells as disclosed herein can offer larger contact areas without utilizing a larger area of a memory chip. Therefore, embodiments of RRAM cells as disclosed herein can afford larger areal densities while increasing the contact area of the electrodes and the resistive layer, which can afford enhanced functioning of the RRAM cell.

Other exemplary embodiments of a RRAM cell are illustrated in FIGS. 3A and 3B. The RRAM cells depicted in FIGS. 3A and 3B include a semiconducting layer 325. Generally, a semiconductor layer 325 if utilized, can function to change the barrier height across the resistive layer 320 which can decrease the switching current. A semiconductor layer 325 if utilized, can also function as a seed layer for the resistive layer 320, which can provide an overlying layer having more desirable properties. A semiconductor layer 325, if utilized, can function to change the barrier height across the resistive layer 320 and function as a seed layer for the resistive layer 320. In such an embodiment, the semiconducting layer 325 is located between the first electrode 310 and the resistive layer 320. The semiconducting layer 325 nests inside the first electrode 310; the resistive layer 320 nests inside the semiconducting layer 325; and the second electrode 330 nests inside the resistive layer 320. As seen in FIG. 3C, the semiconducting layer 325, similar to the other elements, includes a lower portion 348, a continuous side portion 341, and an upper portion 346. The lower portion 348 and the continuous side portion 341 form an inner surface 342 and an outer surface 344. In an embodiment, the outer surface 344 of the semiconducting layer 325 contacts the inner surface 312 of the first electrode 310. In an embodiment, the outer surface 344 of the semiconducting layer 325 directly contacts the inner surface 312 of the first electrode 310. In an embodiment, the inner surface 342 of the semiconducting layer 325 contacts the outer surface 324 of the resistive layer 320. In an embodiment, the inner surface 342 of the semiconducting layer 325 directly contacts the outer surface 324 of the resistive layer 320.

In an embodiment, the first electrode can be fabricated using commonly utilized materials and methods. In an embodiment, the first electrode can be fabricated using techniques that can achieve good conformal sidewall deposition. Exemplary techniques include, but are not limited to, plasma vapor deposition (PVD), ionized plasma based sputtering, long throw sputtering, chemical vapor deposition (CVD) and atomic layer deposition (ALD). In an embodiment, the first electrode can include oxidation resistant metal layers. In an embodiment, the first electrode can include iridium (Ir), platinum (Pt), titanium (Ti), ruthenium (Ru), tantalum (Ta), tungsten (W), copper (Cu), silver (Ag), aluminum (Al) or combinations thereof. In an embodiment, the first electrode can be Ir, Pt, IrO, TiN, TiAlN, Ru, RuO, W, Ta, Cu, Ag, Al, Ta, Pt, $SrRuO_3$, $RuO_2$, poly silicon, yttrium barium copper oxide (also referred to as "YBCO", $YBa_2Cu_3O_7$), or lanthanum strontium copper oxide (also referred to as "LSCO", $La_{2-x}Sr_xCuO_2$). In an embodiment, the first electrode can generally be a substantially constant thickness layer that covers all surfaces of the volume in which it is located. The first electrode can have a thickness (as given by t1 in FIG. 2B) of from about 50 nanometers (nm) to about 100 nm.

In an embodiment, the resistive layer can be fabricated using commonly utilized materials and methods. In an embodiment, the resistive layer can be fabricated using techniques that can achieve good conformal sidewall deposition. Exemplary techniques include, but are not limited to, plasma vapor deposition (PVD), ionized plasma based sputtering, long throw sputtering, chemical vapor deposition (CVD) and atomic layer deposition (ALD). In an embodiment, the resistive layer can include metal oxides, ferroelectric materials or combinations thereof.

In an embodiment, the resistive layer includes a metal oxide material. The metal oxide material can be a binary oxide material or a complex metal oxide material. The metal oxide material can have components including, but not limited to aluminum (Al), titanium (Ti), tantalum (Ta), nickel (Ni), indium (In), zinc (Zn), chromium (Cr), hafnium (Hf), zirconium (Zr), iron (Fe), cobalt (Co), tin (Sn), niobium (Nb), strontium (Sr), manganese (Mn), copper (Cu) and combinations thereof Exemplary binary metal oxides include, but are not limited to, CuO, NiO, CoO, ZnO, $CrO_2$, $TiO_2$, $HfO_2$, $ZrO_2$, $Fe_2O_3$, and $Nb_2O_5$. In an embodiment, the resistive layer includes one or more complex metal oxide materials, including, but not limited to, $Pr_{1-x}Ca_xMnO$ (where $x \leqq 1$), $La_{1-x}Sr_xMnO_3$ (where $x \leqq 1$), $SrFeO_{2.7}$, $RuSr_2GdCu_2O_3$, $YBa_2Cu_3O_7$, and combinations thereof. In an embodiment, the resistive layer includes one or more complex metal oxide materials, including, but not limited to, $Pr_{0.7}Ca_{0.3}MnO_3$, $La_{0.7}Ca_{0.3}MnO_3$ and combinations thereof.

In an embodiment, the resistive layer can include one or more ferroelectric materials, including but not limited to, lead zirconate titanate (also referred to herein as "PZT") having the formula $PbZr_xTi_{1-x}O_3$ where $0<x<1$, lanthanum doped lead zirconate titanate (also referred to herein as "PLZT", also called lead lanthanum zirconate titanate) having the formula $Pb_{0.83}La_{0.17}(Zr_{0.3}Ti_{0.7})_{0.9575}O_3$ (PLZT 17/30/70), $PtTiO_3$, $SrTiO_3$, $BaTiO_3$, $BaSrTiO_3$, $BaBiO$, $SrBi_4Ti_4O_{15}$, $SrBi_2Ta_2O_9$, $SrBi_2TaNaO_3$ (SBNT), $Pb(Mg,Nb)O_3$, $Pb_{1.1}Nb_{0.04}Zr_{0.2}Ti_{0.8}O_3$ (PNZT), $BaMgF_4$, $KNO_3$, and combinations thereof.

In an embodiment, the resistive layer generally covers substantially all of the first electrode surface at a substantially constant thickness, and can have a thickness (as given by t2 in FIG. 2B) of from about 5 nanometers (nm) to about 100 nm. In an embodiment, it can have a thickness from about 5 nm to about 50 nm.

In an embodiment, the second electrode can be fabricated using commonly utilized materials and methods. In an embodiment, the second electrode can be fabricated using techniques that can achieve good conformal sidewall deposition. Exemplary techniques include, but are not limited to, plasma vapor deposition (PVD), ionized plasma based sputtering, long throw sputtering, chemical vapor deposition (CVD) and atomic layer deposition (ALD). In an embodiment, the second electrode can include oxidation resistant metal layers. In an embodiment, the second electrode can include iridium (Ir), platinum (Pt), titanium (Ti), ruthenium (Ru), tantalum (Ta), tungsten (W), copper (Cu), silver (Ag), aluminum (Al) or combinations thereof. In an embodiment, the second electrode can be Ir, Pt, IrO, TiN, TiAlN, Ru, RuO, W, Ta, Cu, Ag, Al, Ta, Pt, $SrRuO_3$, $RuO_2$, poly silicon, yttrium barium copper oxide (also referred to as "YBCO", $YBa_2Cu_3O_7$), or lanthanum strontium copper oxide (also referred to as "LSCO", $La_{2-x}Sr_xCuO_2$).

Relevant dimensions of the second electrode can depend at least in part on the shape of the RRAM cell, which is also the shape of the second electrode. In an embodiment where the RRAM cell is a right circular cylinder (as illustrated for example by FIGS. 1B and 3B), the relevant dimension can be the radius or the diameter. In an embodiment where the RRAM cell is a cuboid shape (as illustrated for example by FIGS. 1A and 3A), the relevant dimension can be the length and depth of the second electrode. In an exemplary embodiment where the RRAM cell is a right circular cylinder, the diameter of the second electrode can range from about 5 nm to about 30 nm. In an embodiment where the RRAM cell is a cuboid, the length and depth of the second electrode (as exemplified by dimensions l3 and d3 in FIG. 2A) can both range from about 5 nm to about 30 nm. In embodiments where l3 and d3 are less than about 15 nm, the RRAM will most likely be cylinder, utilizing commonly known techniques.

Exemplary embodiments of RRAM cells as disclosed herein can include a semiconducting layer as discussed above. The semiconducting layer can be fabricated using commonly utilized materials and methods. In an embodiment, the semiconducting layer can be fabricated using techniques that can achieve good conformal sidewall deposition. Exemplary techniques include, but are not limited to, plasma vapor deposition (PVD), ionized plasma based sputtering, long throw sputtering, chemical vapor deposition (CVD) and atomic layer deposition (ALD).

In an embodiment, the semiconducting layer can include a semiconducting, non-ferroelectric material. In an embodiment, the semiconducting, non-ferroelectric material is a perovskite material. Generally, a perovskite material is any material that has the same type of crystal structures as $CaTiO_3$. Perovskites, can but need not be able to be represented by the general chemical formula of $ABX_3$, where A and B are two cations of very different size, with A generally being larger than B, and X is an anion that bonds to both cations. An example of a semiconducting non-ferroelectric material is a niobium (Nb) doped strontium titanate (SrTiO also referred to as "STO"). Niobium (Nb) doped STO can benefit from the good seed layer characteristics of STO and the semiconducting properties of the niobium (Nb) doping. Other exemplary semiconducting non-ferroelectric materials include, but are not limited to chromium (Cr) doped STO and ruthenium (Ru) doped STO. In an embodiment, the semiconducting layer can have a thickness of from about 50 nanometers (nm) to about 100 nm.

Figure 4:
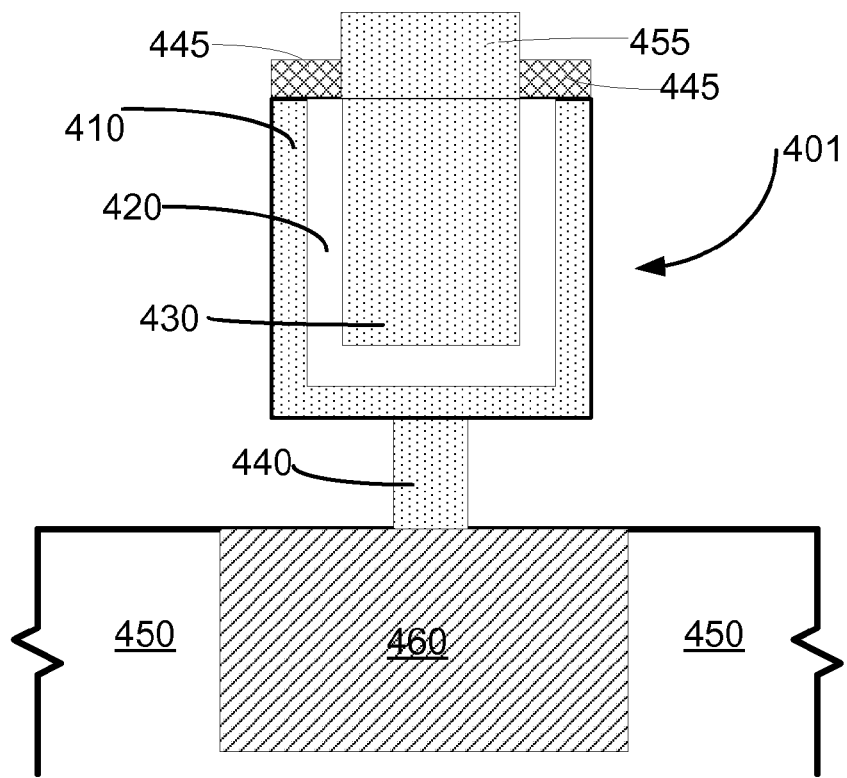
FIG. 4 is a cross sectional illustration of a memory device as exemplified herein.

A RRAM cell as disclosed herein can also include elements that allow the RRAM cell to be electrically connected to other components. FIG. 4 illustrates a RRAM cell 401 that includes a top contact 455 and a bottom contact 440. Elements that are included in FIG. 4 that are analogous to elements included in previous figures (such as FIG. 3C) but are not discussed with respect to FIG. 4 are numbered similarly. In an embodiment, the top contact 455 and the bottom contact 440 need not be present and the first electrode 410 and the second electrode 430 can electrically couple the RRAM cell 401 to another component(s). Generally, the top contact 455 and the bottom contact 440 function to electrically couple or electrically contact the RRAM cell 401 to another component (s). Generally, the top contact 455 and the bottom contact 440 can be made of any conductive material.

In an embodiment the top contact 455 can have a size that is similar to the size of the second electrode 430 so that the maximum contact area is achieved. In an embodiment, an insulating layer 445 can be utilized to electrically insulate the top contact 455 from other portions of the RRAM cell 401, such as the first electrode 410 and the resistive layer 420. In the exemplary embodiment seen in FIG. 4, the insulating layer 445 covers the upper portions of the first electrode 410 and the resistive layer 420. In an embodiment, the top contact is disposed on the upper portion or top surface of the second electrode only; in such an embodiment, the insulating layer 445 can be disposed on the upper portion or top surfaces of the first electrode 410 and the resistive layer 420.

In an embodiment, the bottom contact 440 can electrically connect the RRAM cell 401 to a transistor 460. The transistor 460 may be any kind of transistors commonly utilized with RRAM cells, including but not limited to complimentary metal-oxide-semiconductor transistors (also referred to herein as "CMOS" transistors) such as p-type or n-type metal oxide semiconductor field effect transistors (also referred to herein as "MOSFET" transistors). The transistor 460 may be formed in or on a substrate 450. The RRAM cell 401 may also be formed in, on, or partially in the same substrate 450 or a different substrate and later electrically coupled to the transistor 460.

Figure 5:
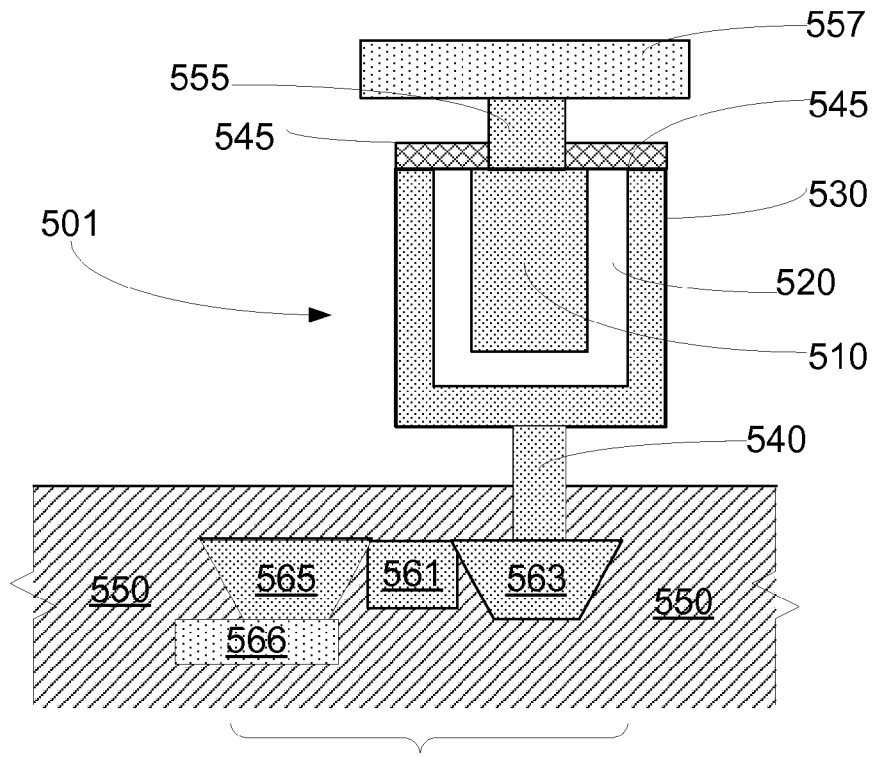
FIG. 5 is a cross sectional illustration of a memory device as exemplified herein.

FIG. 5 illustrates a RRAM cell 501 electrically connected via a bottom contact 540 to a transistor 560. Elements that are included in FIG. 5 that are analogous to elements included in previous figures, such as FIG. 3C, are numbered similarly. In this exemplary embodiment, the transistor 560 includes a drain region 563, a source region 565 and a gate region 561. The source region 565 can be electrically connected to a source line 566; and the top contact 555 can be electrically connected to a bit line 557. Although not shown in FIG. 5, the gate region 561 can, but need not be connected to a word line.

Figure 6:
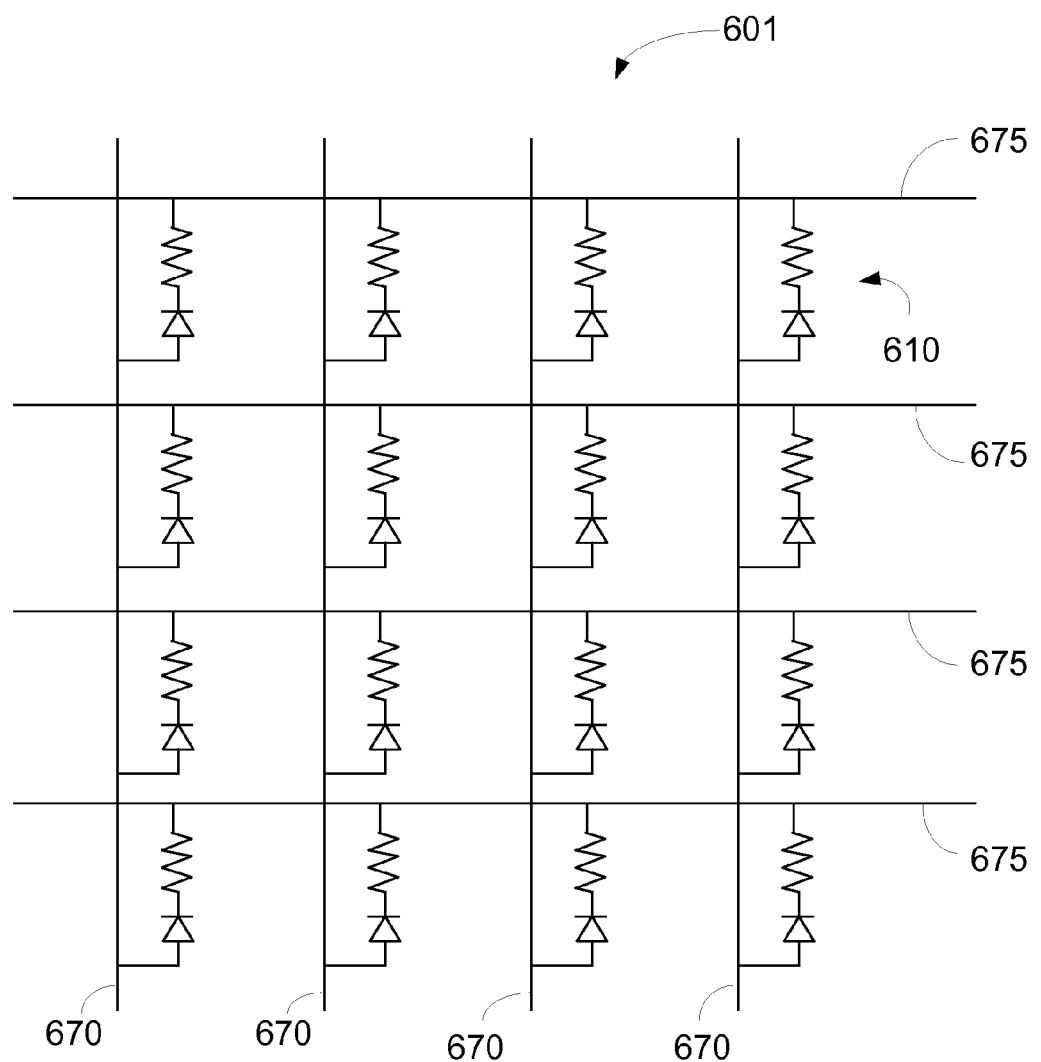
FIG. 6 is a schematic illustration of an exemplary memory array as exemplified herein.

FIG. 6 is a schematic circuit diagram of an illustrative memory array 601. A plurality of memory devices 610 (that each include a RRAM cell and a transistor for example) can be arranged in an array to form the memory array 601. The memory array 601 includes a number of parallel conductive bit lines 675. The memory array 601 also includes a number of parallel conductive word lines 670 that are generally orthogonal to the bit lines 675. The word lines 670 and bit lines 675 form a cross-point array where a memory device 610 can be disposed at each cross-point.

RRAM cells as disclosed herein can be fabricated using commonly utilized semiconductor fabrication techniques. An exemplary method of fabricating a RRAM cell as disclosed herein is exemplified in FIGS. 7A through 7J. The steps depicted in FIGS. 7A to 7J in no way limit the way in which a memory device as disclosed herein can be fabricated. It should also be noted that the figures are not necessarily to scale and do not necessarily depict the article at every state of preparation, i.e. intermediate stages of the article may not be illustrated in the sequence of figures. The materials and processes discussed with respect to FIGS. 7A to 7J also in no way limit materials or processes that can be utilized herein.

Figure 7A:
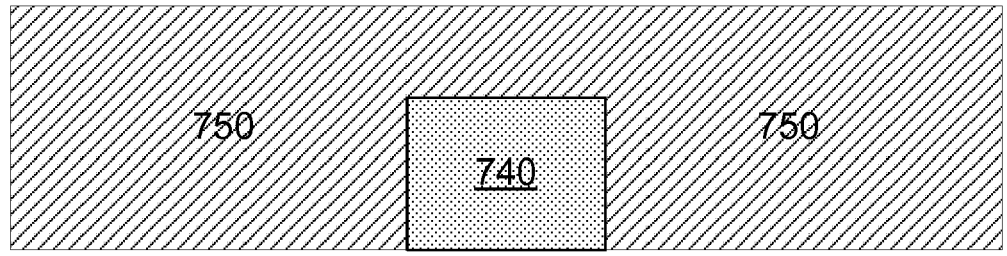
FIGS. 7A through 7J depict an exemplary method of forming a device as disclosed herein.

FIG. 7A depicts a substrate 750. The substrate 750 can include any substrate commonly utilized to fabricate memory devices. Exemplary substrates include, but are not limited to silicon, a mixture of silicon and germanium, and other similar materials. The substrate 750 depicted in FIG. 7A includes an already formed lower contact 740. The lower contact 740 can be formed of any conductive material. Exemplary conductive materials include, but are not limited to, Ag, Au, Pt, W and TiN. The lower contact 740 (as well as other steps in this exemplary method) could have been formed using various etching and patterning techniques. Patterning generally describes a process or a series of processes that shape or alter the existing shape of the deposited materials and can be referred to as lithography. For example, in conventional lithography, the layer to be patterned can be coated with a chemical called photoresist. The photoresist can then be exposed by a stepper, a machine that focuses, aligns, and moves a mask, exposing select portions of the layer to light. The unexposed regions can be washed away by a developer solution. After etching or other processing, the remaining photoresist can be removed using various techniques, such as plasma etching.

Figure 7B:
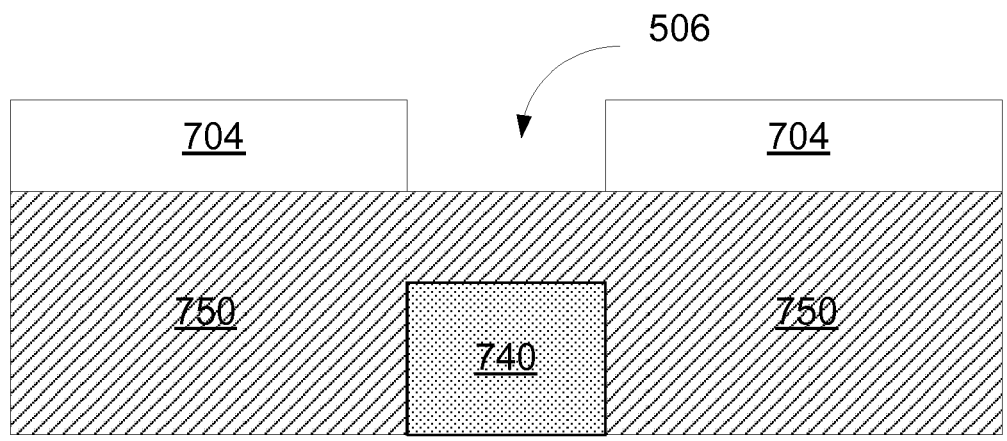
Figure 7C:
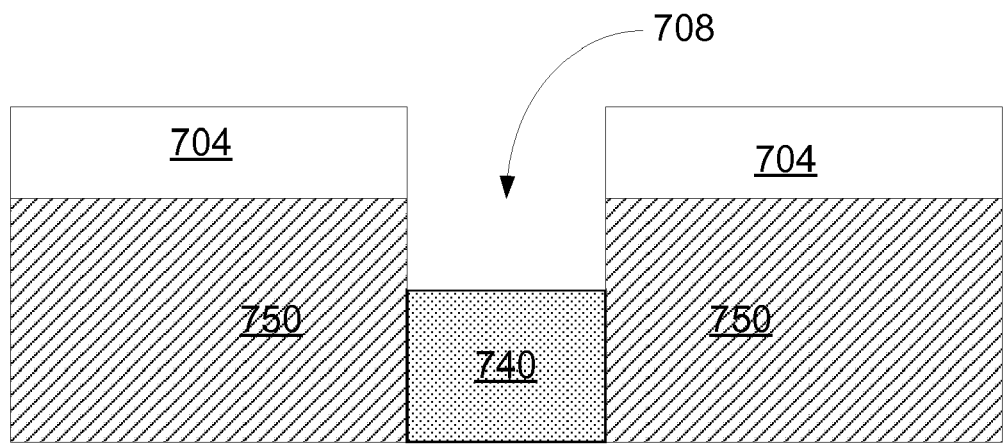

FIG. 7B depicts the article after the next step, deposition and exposure of a photoresist layer to form the photoresist mask 704. Any commonly utilized type of photoresist material and photoresist processing techniques can be utilized herein. The photoresist mask 704 is utilized to etch a portion of the substrate 750 above the lower contact 740, as seen in FIG. 7C. As seen in FIG. 7C the photoresist mask 704 protects a portion of the substrate while the portion that is gone allows etching of the substrate 750 to form a first void 708. Commonly utilized etching techniques can be utilized to etch the substrate 750.

Figure 7D:
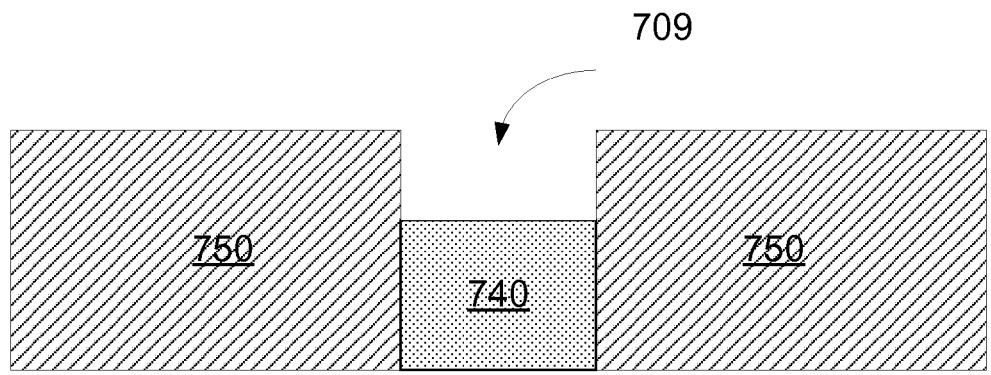

FIG. 7D illustrates the article after the photoresist mask 704 has been removed. Commonly utilized methods of processing and removing photoresist materials can be utilized herein. Removal of the photoresist mask 704 forms a second void 709. The second void 709 will ultimately house the first electrode, the resistive layer and the second electrode of the RRAM cell.

Figure 7E:
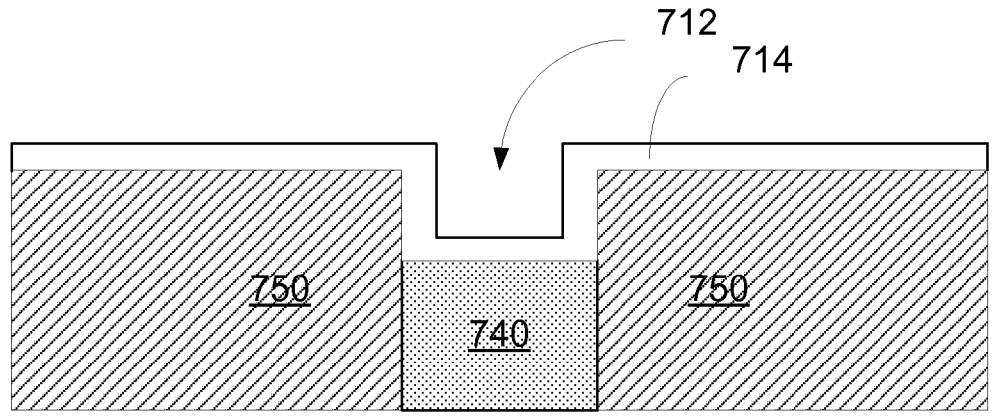

FIG. 7E illustrates the article after a first conductive layer 714 has been deposited on at least a portion of the article. The first conductive layer 714 can generally include materials as discussed above for the first electrode. The first conductive layer 714 can be deposited using techniques including, but not limited to plasma vapor deposition (PVD), ionized plasma based sputtering, long throw sputtering, chemical vapor deposition (CVD) and atomic layer deposition (ALD). Such techniques can deposit a layer of conductive material that can conform to surfaces and sidewalls and produce a layer having substantially the same thickness across the layer. Deposition of the first conductive layer 714 leaves a void, referred to herein as the third void 712. The third void 712 will ultimately house the resistive material and the second electrode of the RRAM cell.

Figure 7F:
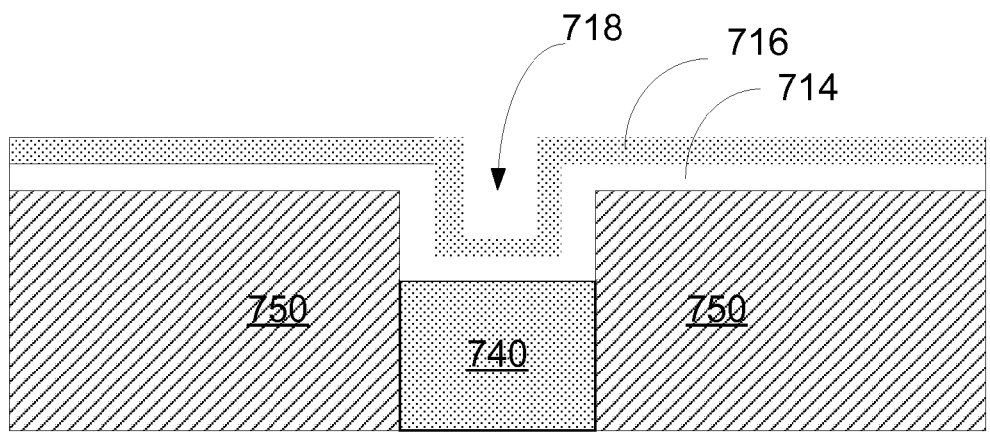

FIG. 7F illustrates the article after a first oxide layer 716 has been deposited on at least a portion of the article. The first oxide layer 716 can generally include materials as discussed above for the resistive layer. The first oxide layer 716 can be deposited using techniques including, but not limited to plasma vapor deposition (PVD), ionized plasma based sputtering, long throw sputtering, chemical vapor deposition (CVD) and atomic layer deposition (ALD). Such techniques can deposit a layer of resistive material that can conform to surfaces and sidewalls and produce a layer having substantially the same thickness across the layer. Deposition of the first oxide layer 716 leaves a void, referred to herein as the fourth void 718. The fourth void 718 will ultimately house the second electrode of the RRAM cell.

Figure 7G:
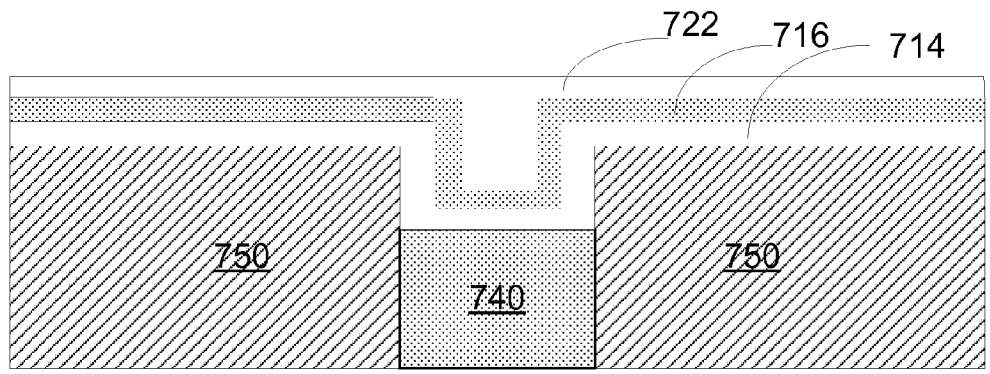

FIG. 7G illustrates the article after a second conductive layer 722 has been deposited on at least a portion of the article. The second conductive layer 722 can generally include materials as discussed above for the second electrode. The second conductive layer 722 can be deposited using techniques including, but not limited to plasma vapor deposition (PVD), ionized plasma based sputtering, long throw sputtering, chemical vapor deposition (CVD) and atomic layer deposition (ALD). Such techniques can deposit a layer of conductive material that can conform to surfaces and sidewalls. Deposition of the second conductive layer 722 generally substantially fills the fourth void 718. The structure present on the substrate 750 at this point in this exemplary method subsumes the entire RRAM cell.

Figure 7H:
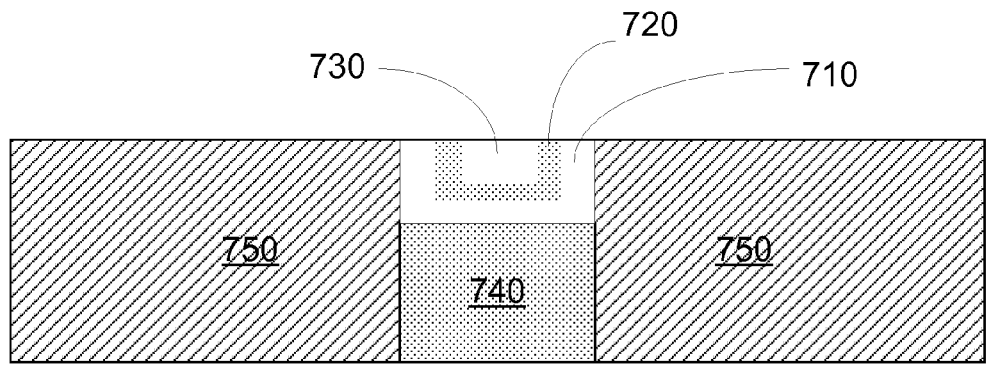

FIG. 7H illustrates the article after the next step, processing of the surface. This step functions to make the top surfaces of the first electrode 710, the resistive layer 720 and the second electrode 730 substantially coplanar with the portions of the substrate 750 surrounding the RRAM cell. An exemplary method of carrying out this processing step includes utilizing chemical-mechanical planarization (CMP).

Figure 7I:
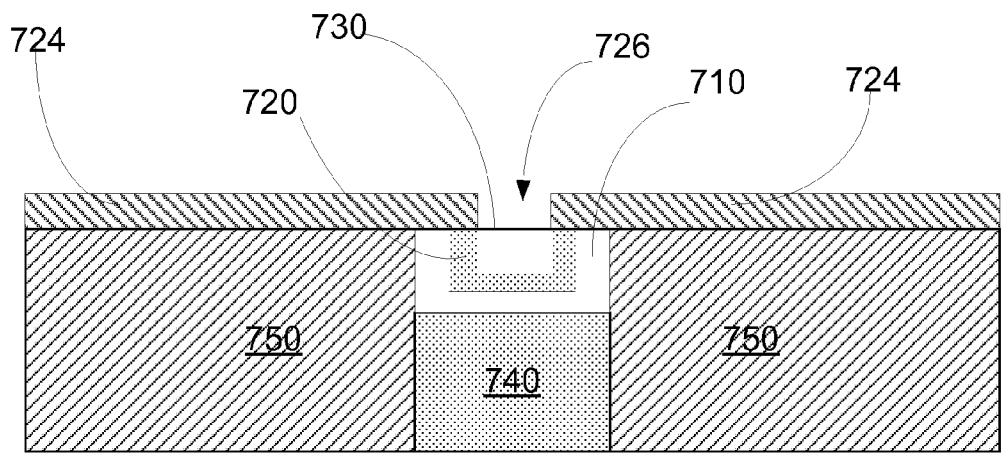

FIG. 7I illustrates the article after an optional step, deposition of an insulating layer 724. The insulating layer generally covers at leas the top surfaces of the first electrode 710 and the resistive layer 720 and in the exemplary embodiment depicted in FIG. 7I covers those structures as well as at least a portion of the exposed substrate 750. As seen in FIG. 7I, the insulating layer 724 does not contact the second electrode 730. The material making up the insulating layer 724 can be deposited using known deposition methods, such as for example physical vapor deposition (PVD), chemical vapor deposition (CVD), electrochemical deposition (ECD), molecular beam epitaxy (MBE) and atomic layer deposition (ALD). Although it is not shown in this scheme of diagrams, a patterning process could occur before, after or before and after the insulating material making up the insulating layer 724 is deposited. The patterning process could include the use of photoresist masks, for example. The insulating layer 724 can include any material that is electrically insulating. Deposition of insulating material and patterning produces not only the insulating layer 724 but also produces a fifth void 726. The fifth void 726 will eventually house the top contact.

Figure 7J:
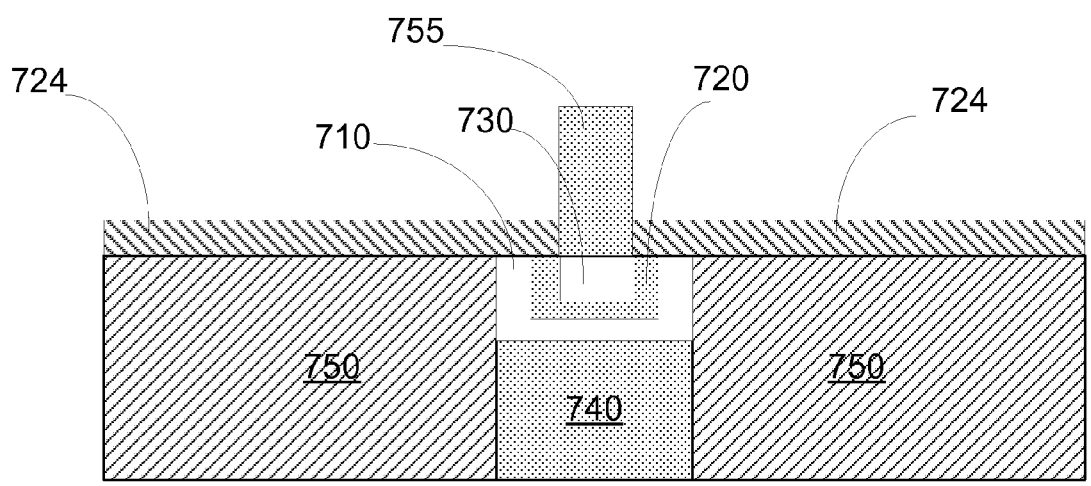

FIG. 7J illustrates the article after another optional step, deposition of the top contact 755. The top contact 755 is deposited in the fifth void 726. The top contact 755 can generally include any conductive material. The top contact 755 can be deposited using known techniques. Generally, formation of the top contact 755 may include a deposition process, a patterning process, an etching process, or some combination thereof.

RRAM cells as disclosed herein can be included in stand alone devices or can be integrated or embedded in devices that utilize the RAM, including but not limited to microprocessors (e.g., computer systems such as a PC e.g., a notebook computer or a desktop computer or a server) microcontrollers, dedicated machines such as cameras, and video or audio playback devices.

Thus, embodiments of STRUCTURES FOR RESISTIVE RANDOM ACCESS MEMORY CELLS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A resistive random access memory (RRAM) cell comprising:

a first electrode having a lower portion, a continuous side portion and an upper portion, the lower portion and the continuous side portion having an outer surface and an inner surface;

a resistive layer having a lower portion, a continuous side portion and an upper portion, the lower portion and the continuous side portion having an outer surface and an inner surface; and a second electrode having a lower portion, an upper portion and an outer surface;

wherein the outer surface of the resistive layer directly contacts the inner surface of the first electrode.

2. The resistive random access memory (RRAM) cell according to claim 1, wherein the inner surface of the resistive layer contacts the outer surface of the second electrode.

3. The resistive random access memory (RRAM) cell according to claim 2, wherein the resistive material comprises a metal oxide material.

4. The resistive random access memory (RRAM) cell according to claim 3, wherein the metal oxide material is chosen from the group consisting of: titanium (Ti), tantalum (Ta), nickel (Ni), indium (In), zinc (Zn), chromium (Cr), hafnium (Hf), zirconium (Zr), iron (Fe), cobalt (Co), tin (Sn), niobium (Nb), strontium (Sr), manganese (Mn) and combinations thereof.

5. The resistive random access memory (RRAM) cell according to claim 3, wherein the metal oxide material is chosen from the group consisting of: $Pr_{1-x}Ca_xMnO$, $SrFeO_{2.7}$, $RuSr_2GdCu_2O_3$, $YBa_2Cu_3O_7$, $La_{1-x}Sr_xMnO_3$ and combinations thereof.

6. The resistive random access memory (RRAM) cell according to claim 3, wherein the metal oxide material is chosen from the group consisting of: $Pr_{0.7}Ca_{0.3}MnO_3$, $La_{0.7}Ca_{0.3}MnO_3$ and combinations thereof.

7. The resistive random access memory (RRAM) cell according to claim 2, wherein the resistive material comprises a ferroelectric material.

8. The resistive random access memory (RRAM) cell according to claim 7, wherein the ferroelectric material is chosen from the group consisting of: lead zirconate titanate (PZT), lanthanum doped lead zirconate titanate (PLZT), $PtTiO_3$, $SrTiO_3$, $BaTiO_3$, $BaSrTiO_3$, $BaBiO$, $SrBi_4Ti_4O_{15}$, $SrBi_2Ta_2O_9$, $SrBi_2TaNaO_3$ (SBNT), $Pb(Mg,Nb)O_3$, $Pb_{1.1}Nb_{0.04}Zr_{0.2}Ti_{0.8}O_3$ (PNZT), $BaMgF_4$, $KNO_3$, and combinations thereof.

9. The resistive random access memory (RRAM) cell according to claim 1 further comprising a semiconducting layer having a lower portion and a continuous side portion, the lower portion and the continuous side portion having an outer surface and an inner surface, wherein the outer surface of the semiconducting layer contacts the inner surface of the first electrode and the inner surface of the semiconducting layer contacts the outer surface of the resistive layer.

10. The resistive random access memory (RRAM) cell according to claim 9, wherein the semiconducting layer is a semiconductive, non-ferroelectric perovskite material.

11. The resistive random access memory (RRAM) cell according to claim 10, wherein the semiconductive, non-ferroelectric perovskite material is chosen from the group consisting of: niobium (Nb) doped strontium titanate (SrTiO), chromium (Cr) doped strontium titanate (SrTiO), ruthenium (Ru) doped strontium titanate (SrTiO) and combinations thereof.

12. The resistive random access memory (RRAM) cell according to claim 1 further comprising a top contact, wherein the top contact is disposed on the top side of the second electrode only.

13. The resistive random access memory (RRAM) cell according to claim 12 further comprising an insulating layer disposed on the top side of the resistive material and the first electrode.

14. The resistive random access memory (RRAM) cell according to claim 1 further comprising a bottom contact, wherein the bottom contact is electrically connected to the first electrode.

15. A resistive random access memory (RRAM) device comprising:
- a resistive random access memory (RRAM) cell comprising:
  - a first electrode having a bottom portion, a continuous side portion and a top portion, the bottom portion and the continuous side portion having an outer surface and an inner surface;
  - a resistive material having a bottom portion, a continuous side portion and a top portion, the bottom portion and the continuous side portion having an outer surface and an inner surface;
  - a second electrode having a bottom portion, a top portion and an outer surface;
  - a bottom contact, electrically connected to the first electrode; and
  - a top contact, electrically connected to the second electrode,
  - wherein the outer surface of the resistive material contacts the inner surface of the first electrode; and
- a transistor,
- wherein the resistive random access memory (RRAM) cell is electrically coupled to the transistor via the bottom contact of the resistive random access memory (RRAM) cell.

16. The resistive random access memory (RRAM) device according to claim 15, wherein the inner surface of the resistive material contacts the outer surface of the second electrode.

17. The resistive random access memory (RRAM) device according to claim 15, further comprising a semiconducting layer having a bottom portion a continuous side portion and a top portion, the bottom portion and the continuous side portion having an outer surface and an inner surface, wherein the outer surface of the semiconducting layer contacts the inner surface of the first electrode and the inner surface of the semiconducting layer contacts the outer surface of the resistive material.

18. The resistive random access memory (RRAM) cell according to claim 15, wherein the resistive material comprises a metal oxide material or a ferroelectric material.

19. The resistive random access memory (RRAM) cell according to claim 17, wherein the semiconducting layer is a semiconductive, non-ferroelectric perovskite material.

20. A memory array comprising:
- a plurality of memory devices, each of the plurality of memory devices comprising:
  - a resistive random access memory cell that comprises:
    - a first electrode having a bottom portion, a continuous side portion and a top portion, the bottom portion and the continuous side portion having an outer surface and an inner surface;
    - a resistive material having a bottom portion, a continuous side portion and a top portion, the bottom portion and the continuous side portion having an outer surface and an inner surface;
    - a second electrode having a bottom portion, a top portion and an outer surface;
    - a bottom contact, electrically connected to the first electrode; and
    - a top contact, electrically connected to the second electrode,
    - wherein the outer surface of the resistive material contacts the inner surface of the first electrode; and
  - a transistor,
and
- a plurality of bit lines; and
- a plurality of source lines,
wherein each of the plurality of memory cells is operatively coupled between a bit line and a source line, the plurality of memory cells are arranged in a matrix and the bit lines and source lines connect the plurality of memory cells.

* * * * *